(12) United States Patent
Chang

(10) Patent No.: US 8,363,013 B2
(45) Date of Patent: Jan. 29, 2013

(54) INPUT DEVICE WITH CLICK BUTTON

(75) Inventor: A-Ming Chang, Taipei (TW)

(73) Assignee: Primax Electronics Ltd., Taipei (TW)

( * ) Notice: Subject to any disclaimer, the term of this patent is extended or adjusted under 35 U.S.C. 154(b) by 636 days.

(21) Appl. No.: 12/637,645

(22) Filed: Dec. 14, 2009

(65) Prior Publication Data

US 2011/0084905 A1 Apr. 14, 2011

(30) Foreign Application Priority Data

Oct. 9, 2009 (TW) .............................. 98134290 A

(51) Int. Cl.
*G09G 5/08* (2006.01)
(52) U.S. Cl. ....................................................... 345/163
(58) Field of Classification Search .................. 345/160, 345/163, 167; 200/50.36, 251; 400/120.17
See application file for complete search history.

(56) References Cited

U.S. PATENT DOCUMENTS

| 2006/0250364 | A1* | 11/2006 | Gorbunov ..................... 345/163 |
| 2008/0129695 | A1* | 6/2008 | Li ................................. 345/163 |
| 2008/0297475 | A1* | 12/2008 | Woolf et al. .................. 345/163 |

* cited by examiner

*Primary Examiner* — Hoa T Nguyen
*Assistant Examiner* — Andrew Sasinowski
(74) *Attorney, Agent, or Firm* — Apex Juris, pllc; Tracy M. Heims

(57) ABSTRACT

A button-type input device includes an upper cover, a base, a click button, a circuit board, a tactile switch, a first lever, and a second lever. The click button has a pressing part. The tactile switch is mounted on the circuit board, and has a salient. The first lever is arranged between the pressing part of the click button and the salient of the tactile switch. An end of the first lever is served as a first fulcrum. The second lever is arranged above the first lever and between the pressing part of the click button and the salient of the tactile switch. An end of the second lever is served as a second fulcrum. The second fulcrum is opposite to the first fulcrum. A downward force of the pressing part acting on the first lever is adjustable when the second lever is moved with respect to the base.

13 Claims, 4 Drawing Sheets

INPUT DEVICE WITH CLICK BUTTON

FIELD OF THE INVENTION

The present invention relates to an input device, and more particularly to a button-type input device such as a mouse.

BACKGROUND OF THE INVENTION

A mouse is a common button-type input device. Generally, the downward force required to trigger the tactile switch of the mouse is constant and fails to be adjusted. FIG. 1 is a schematic side view illustrating a button-type input device according to the prior art. As shown in FIG. 1, the input device 10 is a mouse. The input device 10 comprises a base 101, an upper cover 102, a click button 103, a tactile switch 104 and a circuit board 105. The tactile switch 104 is mounted on and connected to the circuit board 105. In response to a downward force exerted on the click button 103, the post-like pressing part 106 attached to the underside of click button 103 moves downwardly to touch the salient 107 attached on a top surface of the tactile switch 104. As such, a corresponding clicking operation is executed. Since the downward force for triggering the tactile switch of the mouse fails to be adjusted, a process of quickly clicking the click button for a long time period usually incurs unacceptable fatigue of the user's hand. As the demand on comfort of using the button-type input device is gradually increased, the conventional button-type input device is not satisfactory.

SUMMARY OF THE INVENTION

It is an object of the present invention to provide a button-type input device for selectively adjusting the downward force within a broader range in order to obviate the drawbacks encountered from the prior art.

In accordance with an aspect of the present invention, there is provided a button-type input device. The button-type input device includes an upper cover, a base, a click button, a circuit board, a tactile switch, a first lever, and a second lever. The click button has a pressing part. The circuit board is disposed within a housing collectively defined by the upper cover, the base and the click button. The tactile switch is mounted on the circuit board, and has a salient. The first lever is arranged between the pressing part of the click button and the salient of the tactile switch. An end of the first lever is served as a first fulcrum. The second lever is arranged above the first lever and between the pressing part of the click button and the salient of the tactile switch. An end of the second lever is served as a second fulcrum. The second fulcrum is opposite to the first fulcrum. The second lever is movable with respect to the base. A downward force of the pressing part acting on the first lever is adjustable by moving the second lever with respect to the base.

In an embodiment, a pressing point is formed on an underside of the first lever and corresponding to the salient of the tactile switch, and a sustaining point is formed on an underside of the second lever and sustained against the first lever. A distance of the sustaining point with respect to the pressing part of the click button and the pressing point of the first lever is adjusted by moving the second lever.

In an embodiment, the button-type input device further includes an adjustable element. The second fulcrum of the second lever is pivotally coupled to the adjustable element. The adjustable element further includes a gliding part. A guiding slot is formed in a bottom plate of the base and runs through top and bottom surfaces of the bottom plate of the base. The gliding part is accommodated within the guiding slot and movable along the guiding slot, so that the second lever is moved with respect to the base.

In an embodiment, the adjustable element is an L-shaped pedestal structure, and includes a bottom plate and a connecting seat disposed on a surface of the bottom plate. The connecting seat includes two connecting pieces. The second lever is pivotally interconnected between the two connecting pieces.

In an embodiment, the gliding part is protruded from an underside of the bottom plate of the adjustable element.

In an embodiment, a protruded operating part is formed on an underside of the gliding part.

In an embodiment, the gliding part of the adjustable element is permitted to be positioned at some different positions of the guiding slot in a multi-stage manner.

In an embodiment, the pressing part of the click button, the sustaining point of the second lever, the pressing point of the first lever and the salient of the tactile switch are substantially arranged in the same line when the gliding part is located at an end of the guiding slot; and a distance of the sustaining point of the second lever with respect to the pressing point of the first lever and the salient of the tactile switch is increased when the gliding part is glided toward the other end of the guiding slot.

In an embodiment, the gliding part of the adjustable element is permitted to be positioned at any position along the guiding slot.

In an embodiment, the second lever is moved with respect to left and right sides of the base.

In an embodiment, the button-type input device is a mouse.

In an embodiment, the second lever is moved with respect to front and rear sides of the base.

In an embodiment, the pressing part is post-like.

By using the button-type input device of the present invention, the downward force exerted on the click button may be adjusted in two levels according to the practical requirements. More specially, the downward force of the click button of the button-type input device may be selectively adjusted within a broader range when compared with the prior art technology. Since the downward force is adjustable, the user of the button-type input device feels more comfortable. As a consequence, the problem of incurring unacceptable fatigue of the user's hand in the case that the downward force fails to be adjusted will be solved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

The present invention provides a button-type input device. The present invention will now be described more specifically with reference to the following drawings and embodiments.

Figure 1:
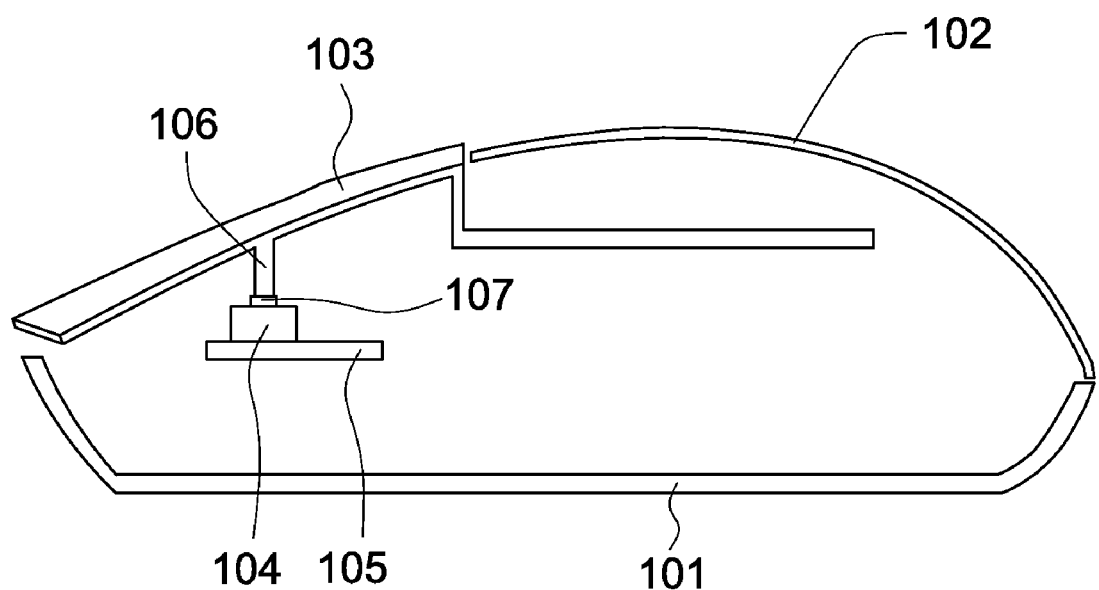
FIG. 1 is a schematic side view illustrating a button-type input device according to the prior art.
Figure 2:
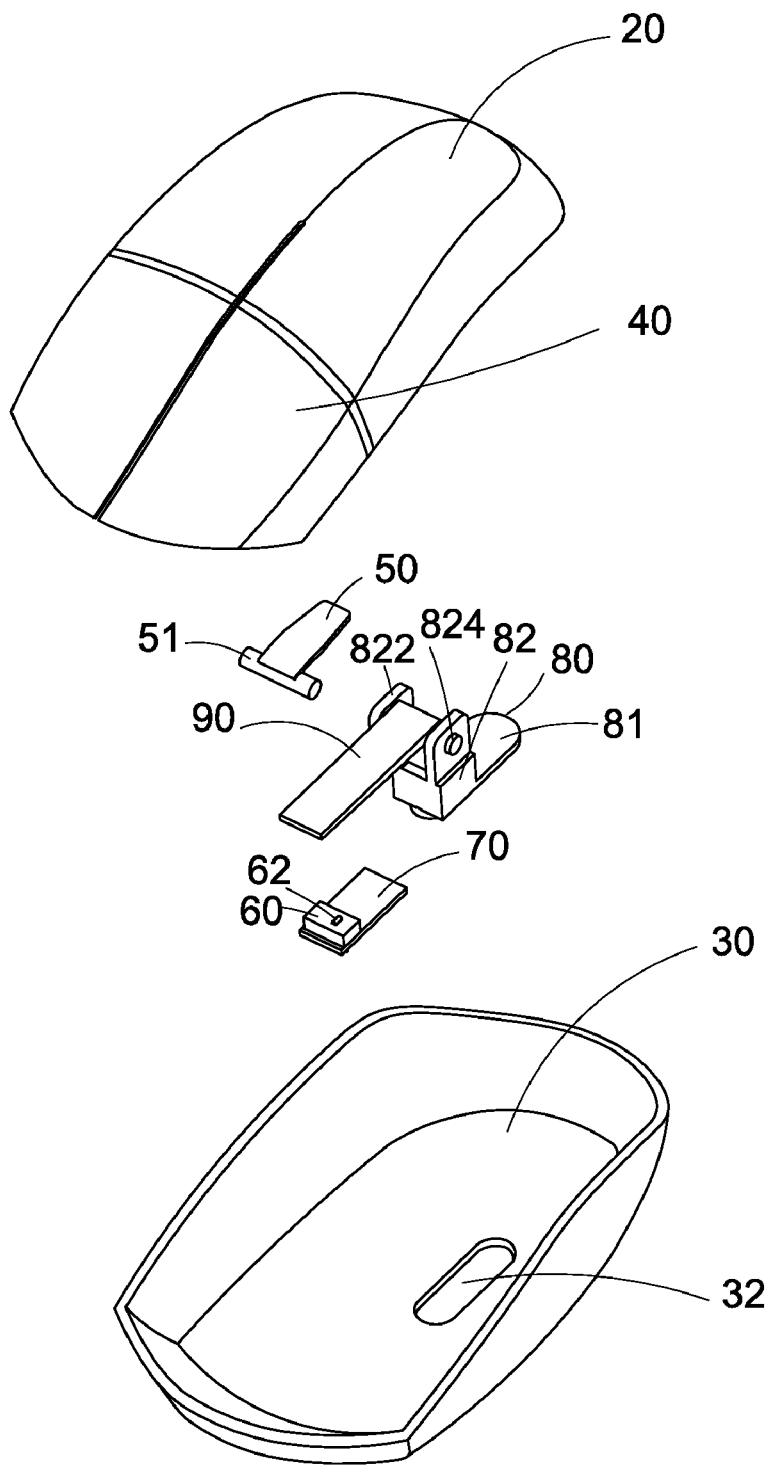
FIG. 2 is a schematic exploded view illustrating a portion of a button-type input device according to an embodiment of the present invention.

FIG. 2 is a schematic exploded view illustrating a portion of a button-type input device according to an embodiment of the present invention.

Figure 3:
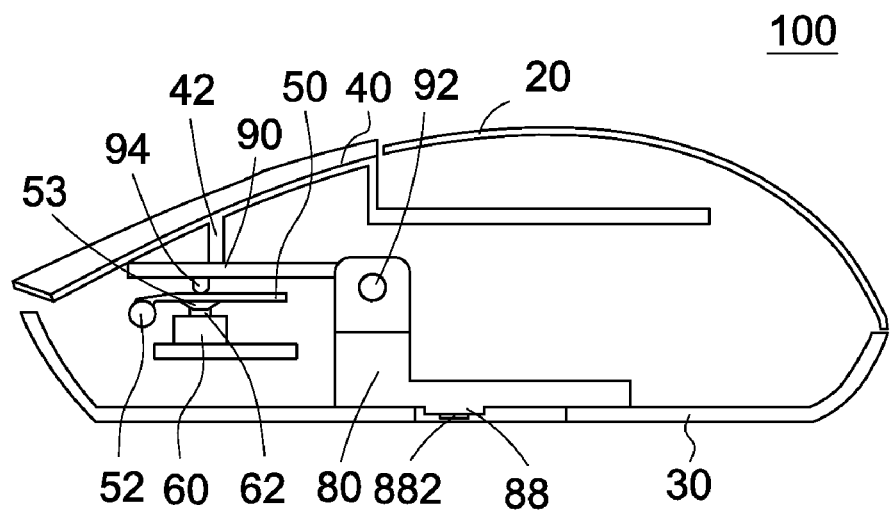
FIG. 3 is a schematic side view illustrating the button-type input device according to the embodiment of the present invention, in which the adjustable element of the input device is located at a first position.
Figure 4:
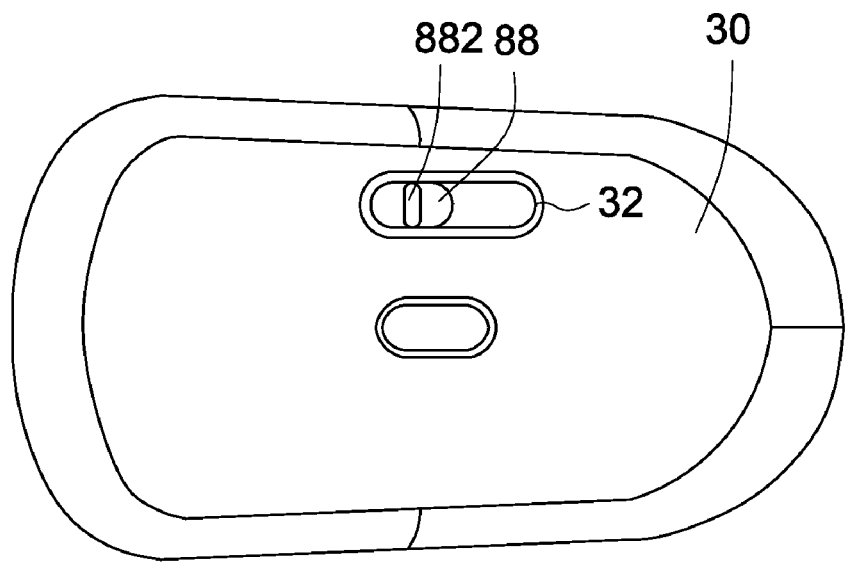
FIG. 4 is a schematic rear view of the button-type input device of FIG. 3.

FIG. 3 is a schematic side view illustrating the button-type input device according to the embodiment of the present invention, in which the adjustable element of the input device is located at a first position. FIG. 4 is a schematic rear view of the button-type input device of FIG. 3. Please refer to FIGS. 2, 3 and 4. In this embodiment, the button-type input device 100 is a mouse. The input device 100 comprises an upper cover 20, a base 30, a click button 40, a first lever 50, a tactile switch 60, a circuit board 70, an adjustable element 80 and a second lever 90. The tactile switch 60 is mounted on and connected to the circuit board 70. The upper cover 20, the base 30 and the click button 40 collectively define a housing of the mouse 100. The first lever 50, the circuit board 70 and the adjustable element 80 are disposed within the housing.

The first lever 50 is arranged between the second lever 90 and the tactile switch 60. A first end (e.g. a front end) of the first lever 50 is a pivotal end. Via a pivot shaft 51, the pivotal end of the first lever 50 is pivotally coupled to a component (not shown) that is attached on the base 30. That is, the pivotal end of the first lever 50 is served as a first fulcrum 52. In addition, a pressing point 53 is formed on the underside of the first lever 50 and near the pivotal end. In response to a downward external force exerted on the click button 40, the pressing point 53 is moved downwardly to touch a salient 62 on a top surface of the tactile switch 60.

As such, the tactile switch 60 is triggered to generate a corresponding clicking signal. The clicking signal is transmitted to a computer system (not shown) through the circuit board 70. In addition, the circuit board 70 is immobile with respect to the base 30.

The adjustable element 80 is an L-shaped pedestal structure. In this embodiment, the adjustable element 80 comprises a bottom plate 81 and a connecting seat 82. The connecting seat 82 is disposed on a surface and at an edge of the bottom plate 81. The connecting seat 82 comprises two connecting pieces 822. Via a pivotal shaft 824, the second lever 90 is pivotally interconnected between the two connecting pieces 822.

The second lever 90 is a slab structure. A first end of the second lever 90 is pivotally coupled to the pivotal shaft 824. That is, the first end of the second lever 90 is served as a second fulcrum 92. In addition, a sustaining point 94 is formed on an underside and near a second end of the second lever 90. A post-like pressing part 42 is attached to the underside of click button 40. The second lever 90 is arranged between the post-like pressing part 42 and the first lever 50. In addition, the sustaining point 94 of the second lever 90 is in contact with the first lever 50.

Furthermore, a gliding part 88 is protruded from an underside of the bottom plate 81 of the adjustable element 80. A guiding slot 32 is formed in the bottom plate of the base 30 and through the top surface and the bottom surface of the bottom plate of the base 30. The gliding part 88 is accommodated within the guiding slot 32. In response to an external force, the gliding part 88 is movable along the guiding slot 32 and positioned at front and rear ends of the guiding slot 32. In addition, a protruded operating part 882 is formed on the underside of the gliding part 88. From the guiding slot 32, the user may change the position of the adjustable element 80 by manipulating the protruded operating part 882. By changing the position of the adjustable element 80, the distance of the sustaining point 94 of the second lever 90 with respect to the post-like pressing part 42 of the click button 40 and the pressing point 53 of the first lever 50 will be adjusted.

Figure 5:
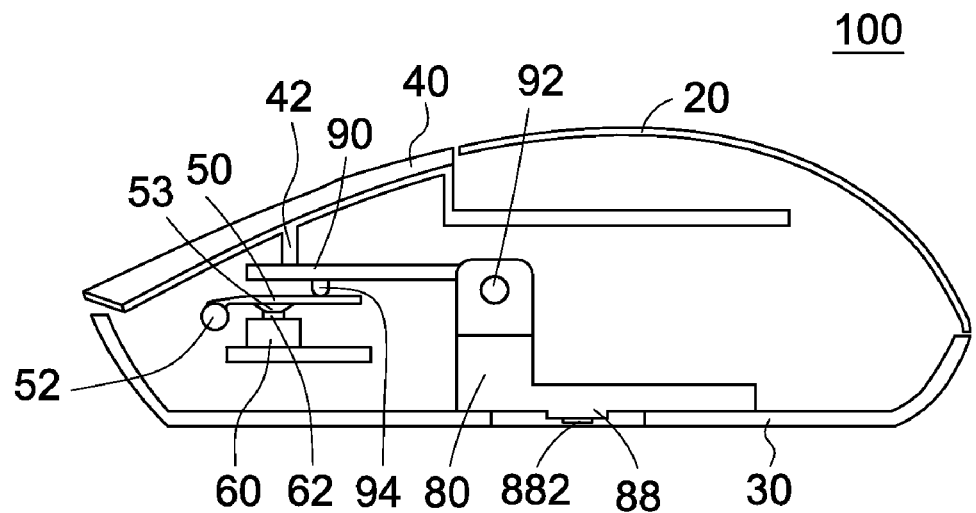
FIG. 5 is a schematic side view illustrating the button-type input device according to the embodiment of the present invention, in which the adjustable element of the input device is located at a second position.
Figure 6:
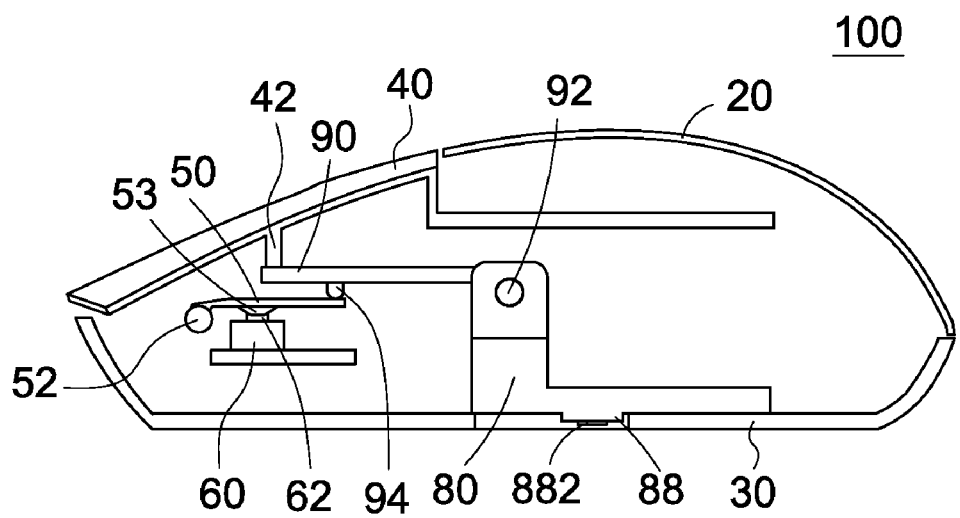
FIG. 6 is a schematic side view illustrating the button-type input device according to the embodiment of the present invention, in which the adjustable element of the input device is located at a third position.

FIG. 5 is a schematic side view illustrating the button-type input device according to the embodiment of the present invention, in which the adjustable element of the input device is located at a second position. FIG. 6 is a schematic side view illustrating the button-type input device according to the embodiment of the present invention, in which the adjustable element of the input device is located at a third position. Hereinafter, the principle of adjusting the downward force on the click button 40 will be illustrated with reference to FIGS. 3, 4, 5 and 6.

As shown in FIGS. 3 and 4, the gliding part 88 of the adjustable element 80 is moved to a first position of the guiding slot 32 of the base 30. That is, the gliding part 88 is located at the forefront end of the guiding slot 32. Meanwhile, the post-like pressing part 42 of the click button 40, the sustaining point 94 of the second lever 90, the pressing point 53 of the first lever 50 and the salient 62 of the tactile switch 60 are substantially arranged in the same line (see FIG. 3). By applying a downward force F1 on the click button 40, the salient 62 is moved downwardly to trigger the tactile switch 60.

Please refer to FIG. 5. The gliding part 88 of the adjustable element 80 is moved to a second position of the guiding slot 32 of the base 30. That is, the gliding part 88 is located at the middle of the guiding slot 32 of the base 30. Meanwhile, the distance of the sustaining point 94 of the second lever 90 with respect to the post-like pressing part 42 of the click button 40 and the pressing point 53 of the first lever 50 is increased. The first ends of the first lever 50 and the second lever 90 are respectively served as a first fulcrum 52 and a second fulcrum 92. In addition, the first fulcrum 52 and the second fulcrum 92 are arranged on opposite ends. According to a lever principle, the downward force exerted on the click button 40 is smaller than the load force of the sustaining point 94 of the second lever 90 acting on the first lever 50; and the load force of the sustaining point 94 of the second lever 90 acting on the first lever 50 is smaller than the load force of the pressing point 53 of the first lever 50 acting on the salient 62 of the tactile switch 60. Under this circumstance, when a downward force F2 smaller than F1 is exerted on the click button 40, the salient 62 is moved downwardly to trigger the tactile switch 60.

Please refer to FIG. 6. The gliding part 88 of the adjustable element 80 is moved to a third position of the guiding slot 32 of the base 30. That is, the gliding part 88 is located at the rear end of the guiding slot 32 of the base 30. Since the distance of the sustaining point 94 of the second lever 90 with respect to the post-like pressing part 42 of the click button 40 and the pressing point 53 of the first lever 50 is further increased, a downward force F3 required for triggering the tactile switch 60 is smaller than the downward force F2. In other words, by switching the gliding part 88 from the front end to the rear end of the guiding slot 32, the downward force exerted on the click button 40 will be largely reduced.

In the above embodiment, by using the button-type input device 100 of the present invention, the downward force exerted on the click button 40 may be adjusted in two levels according to the practical requirements. More specially, the downward force of the click button 40 of the button-type input device 100 may be selectively adjusted within a broader range when compared with the prior art technology. Since the downward force is adjustable, the user of the button-type input device 100 feels more comfortable. As a consequence, the problem of incurring unacceptable fatigue of the user's hand in the case that the downward force fails to be adjusted will be solved. For adjusting the downward force on the click button 40, the user only needs to manipulate the protruded operating part 882 to have the gliding part 88 of the adjustable element 80 moved along the guiding slot 32 to a desired position.

In the above embodiment, the gliding part 88 of the adjustable element 80 may be positioned at some different positions of the guiding slot 32 in a multi-stage manner. Alternatively, the gliding part 88 of the adjustable element 80 may be positioned at any position along the guiding slot 32 in a linear manner, so that the precision of adjusting the downward force on the click button 40 is increased. In addition, the post-like pressing part 42 of the click button 40 may be contacted with the second lever 90.

In the above embodiment, the guiding slot 32 is elongated in the direction toward the front and rear sides of the base 30. Nevertheless, the guiding slot 32 may be elongated in the direction toward the left and right sides of the base 30. Under this circumstance, the first lever 50, the adjustable element 80 and the second lever 90 are rotated by 90 degrees with respect to the axial lines normal to the base 30. As such, the adjustable element 80 is moved with respect to the left and right sides of the base 30. Similarly, by changing the position of the adjustable element 80, the distance of the sustaining point 94 of the second lever 90 with respect to the post-like pressing part 42 of the click button 40 and the pressing point 53 of the first lever 50 will be adjusted.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A button-type input device comprising:
   an upper cover;
   a base;
   a click button having a pressing part;
   a circuit board disposed within a housing collectively defined by said upper cover, said base and said click button;
   a tactile switch mounted on said circuit board, and having a salient;
   a first lever arranged between said pressing part of said click button and said salient of said tactile switch, wherein an end of said first lever is served as a first fulcrum; and
   a second lever arranged above said first lever and between said pressing part of said click button and said salient of said tactile switch, wherein an end of said second lever is served as a second fulcrum, said second fulcrum is opposite to said first fulcrum, and said second lever is movable with respect to said base, wherein a downward force of said pressing part acting on said first lever is adjustable when said second lever is moved with respect to said base.

2. The button-type input device according to claim 1 wherein a pressing point is formed on an underside of said first lever and corresponding to said salient of said tactile switch, and a sustaining point is formed on an underside of said second lever and sustained against said first lever, wherein a distance of said sustaining point with respect to said pressing part of said click button and said pressing point of said first lever is adjusted by moving said second lever.

3. The button-type input device according to claim 2 further comprising an adjustable element, wherein said second fulcrum of said second lever is pivotally coupled to said adjustable element, said adjustable element further includes a gliding part, and a guiding slot is formed in a bottom plate of said base and through top and bottom surfaces of said bottom plate of said base, wherein said gliding part is accommodated within said guiding slot and movable along said guiding slot, so that said second lever is moved with respect to said base.

4. The button-type input device according to claim 3 wherein said adjustable element is an L-shaped pedestal structure, and comprises a bottom plate and a connecting seat disposed on a surface of said bottom plate, wherein said connecting seat comprises two connecting pieces, and said second lever is pivotally interconnected between said two connecting pieces.

5. The button-type input device according to claim 4 wherein said gliding part is protruded from an underside of said bottom plate of said adjustable element.

6. The button-type input device according to claim 3 wherein a protruded operating part is formed on an underside of said gliding part.

7. The button-type input device according to claim 3 wherein said gliding part of said adjustable element is permitted to be positioned at some different positions of said guiding slot in a multi-stage manner.

8. The button-type input device according to claim 7 wherein said pressing part of said click button, said sustaining point of said second lever, said pressing point of said first lever and said salient of said tactile switch are substantially arranged in the same line when said gliding part is located at an end of said guiding slot, and a distance of said sustaining point of the second lever with respect to said pressing point of said first lever and said salient of said tactile switch is increased when said gliding part is located at the other end of said guiding slot.

9. The button-type input device according to claim 3 wherein said gliding part of said adjustable element is permitted to be positioned at any position along said guiding slot.

10. The button-type input device according to claim 1 wherein said button-type input device is a mouse.

11. The button-type input device according to claim 1 wherein said second lever is moved with respect to left and right sides of said base.

12. The button-type input device according to claim 1 wherein said second lever is moved with respect to front and rear sides of said base.

13. The button-type input device according to claim 1 wherein said pressing part is post-like.

* * * * *